(12) United States Patent
Choi

(10) Patent No.: US 9,426,878 B2
(45) Date of Patent: Aug. 23, 2016

(54) NONWOVEN ADHESIVE TAPES AND ARTICLES THEREFROM

(71) Applicant: 3M INNOVATIVE PROPERTIES COMPANY, St. Paul, MN (US)

(72) Inventor: Jeongwan Choi, Suwon-Si (KR)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 13/811,681

(22) PCT Filed: Oct. 18, 2012

(86) PCT No.: PCT/US2012/060703
§ 371 (c)(1),
(2) Date: Jan. 23, 2013

(87) PCT Pub. No.: WO2013/062836
PCT Pub. Date: May 2, 2013

(65) Prior Publication Data
US 2014/0069698 A1    Mar. 13, 2014

Related U.S. Application Data

(60) Provisional application No. 61/551,199, filed on Oct. 25, 2011.

(51) Int. Cl.
*H05K 1/09* (2006.01)
*H05K 1/02* (2006.01)
(Continued)

(52) U.S. Cl.
CPC ............. *H05K 1/02* (2013.01); *C09J 7/048* (2013.01); *C09J 9/02* (2013.01)

(58) Field of Classification Search
CPC .... H05K 1/092; H05K 1/095; H05K 1/0306; H05K 1/0313; H01B 1/14; H01B 1/16; H01B 1/20; H01B 1/22
USPC .......................................................... 174/257
See application file for complete search history.

(56) References Cited

U.S. PATENT DOCUMENTS 2,808,352 A    10/1957   Coleman
3,475,213 A    10/1969   Stow
(Continued)

FOREIGN PATENT DOCUMENTS

EP    0256756 A2 *   2/1988
IE    1984-1147      12/1984
(Continued)

OTHER PUBLICATIONS

Yamada. Japanese Patent Publication No. 2002-327154. Nov. 15, 2002.*

(Continued)

*Primary Examiner* — Tremesha S Willis

(57) ABSTRACT

A conductive double-sided tape includes a conductive, nonwoven adhesive layer including an adhesive material, a nonconductive, nonwoven substrate having a plurality of passageways, and a plurality of conductive particles penetrating through the nonconductive, nonwoven substrate and the adhesive material. The nonconductive, nonwoven substrate is embedded in the adhesive material. The conductive particles have a D99 particle size larger than a thickness of the nonconductive, nonwoven substrate and the adhesive material.

17 Claims, 2 Drawing Sheets

(51) Int. Cl.
*C09J 9/02* (2006.01)
*C09J 7/04* (2006.01)

(56) References Cited

U.S. PATENT DOCUMENTS

| | | | |
|---|---|---|---|
| 3,762,946 A | 10/1973 | Stow | |
| 3,778,306 A | 12/1973 | Stow | |
| 4,113,981 A * | 9/1978 | Fujita et al. | 174/88 R |
| 4,548,862 A | 10/1985 | Hartman | |
| 4,606,962 A | 8/1986 | Reylek | |
| 5,082,595 A | 1/1992 | Glackin | |
| 5,087,494 A | 2/1992 | Calhoun | |
| 5,240,761 A | 8/1993 | Calhoun | |
| 5,246,771 A * | 9/1993 | Kawaguchi | C09J 7/02 428/344 |
| 5,300,340 A | 4/1994 | Calhoun | |
| 5,339,038 A * | 8/1994 | Boenning | G01R 31/021 174/106 SC |
| 5,902,438 A * | 5/1999 | Arthur | H05K 3/321 156/247 |
| 5,939,190 A | 8/1999 | Pfaff | |
| 8,105,964 B2 * | 1/2012 | Cawse | B32B 5/22 428/929 |
| 2003/0217457 A1 * | 11/2003 | Hwang | C25D 5/16 29/610.1 |
| 2005/0062024 A1 | 3/2005 | Bessette | |
| 2008/0308295 A1 | 12/2008 | Fu | |

FOREIGN PATENT DOCUMENTS

| | | |
|---|---|---|
| JP | 2002-327154 | 11/2002 |
| KR | 2009/0067964 | 6/2009 |
| WO | WO 2005-017012 | 2/2005 |
| WO | WO 2009-085631 | 7/2009 |

OTHER PUBLICATIONS

International Search Report for PCT Application No. PCT/US2012/060703, mailed on Mar. 29, 2013, 3 pages.

* cited by examiner

NONWOVEN ADHESIVE TAPES AND ARTICLES THEREFROM

CROSS REFERENCE TO RELATED APPLICATIONS

This application claims priority from U.S. Provisional Application Ser. No. 61/551,199, filed Oct. 25, 2011, the disclosure of which is incorporated by reference in its/their entirety herein.

TECHNICAL FIELD

The present invention generally relates to electrically conductive tapes. In particular, the present invention is a conductive double-sided tape and a conductive single-sided tape having a nonwoven pressure sensitive adhesive layer including a nonconductive, nonwoven substrate, an adhesive material and conductive particles.

BACKGROUND

Electrically conductive foil tapes have numerous constructions and have conventionally been formed using various methods. For example, in one construction, an electrically conductive adhesive tape can be formed by dispersing finely divided silver in a pressure sensitive adhesive and coating the adhesive on an electrically conductive foil backing. In another construction, a conductive tape is formed with a monolayer of large conductive particles on the pressure sensitive adhesive. In yet another embodiment, an electrically conductive foil backing is embossed to have a plurality of closely spaced electrically conductive projections that extend almost through the layer of adhesive. One characteristic common to all of these constructions is that they do not provide good conformability to various adherents because of the stiffness of the foil backing.

There is an increasing demand for thin, conductive double-sided tapes and thin, conductive flexible single-sided foil tapes, both of which can provide good conformance, flexibility and strength. This is in part because connections to edged curvatures or various rough surfaces are becoming more important for many electronic uses of the conductive tapes and the tapes are required to conform to these topographical features. However, when the tape is fabricated to improve conformance and flexibility via a thinner adhesive or foil layer, the tape becomes difficult to handle because of its reduced strength.

There has also been an increasing demand for thinner conductive single-sided tapes which can provide good workability and handling properties. This is generally because most foil tapes are easily curled when the release liner is removed from the adhesive. The curling may become more severe as the foil backing become thinner.

SUMMARY

In one embodiment, the present invention is a conductive, double-sided tape including a conductive, nonwoven adhesive layer comprising an adhesive material, a nonconductive, nonwoven substrate having a plurality of passageways, and a plurality of conductive particles penetrating through the nonconductive, nonwoven substrate and the adhesive material. The nonconductive, nonwoven substrate is embedded in the adhesive material. The conductive particles have a D99 particle size larger than a thickness of the nonconductive, nonwoven substrate.

In another embodiment, the present invention is a conductive, single-sided tape. The conductive, single-sided tape includes an adhesive material, a nonwoven substrate embedded within the adhesive material, a plurality of conductive particles penetrating through the nonwoven substrate and the adhesive material, and a metal layer positioned adjacent the nonwoven adhesive layer. The conductive particles have a D99 particle size larger than a thickness of the nonwoven substrate.

DETAILED DESCRIPTION

Figure 1:
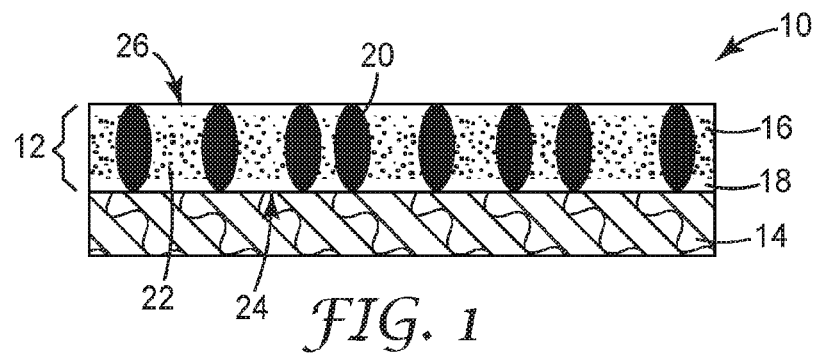
FIG. 1 is a cross-sectional view of an embodiment of a conductive, double-sided tape of the present invention.

FIG. 1 shows a cross-sectional view of an embodiment of a conductive, double-sided tape 10 including a conductive, nonwoven adhesive layer 12 on a release liner 14. The conductive, nonwoven adhesive layer 12 includes an adhesive material 18, a nonconductive, nonwoven substrate 16 embedded in the adhesive material 18, and conductive particles 20 penetrating through the nonwoven substrate 16 and the adhesive material 18. The conductive, nonwoven adhesive layer 12 provides conductive, double-sided tape 10 and conductive single-sided tapes 100 (FIGS. 2 and 3) with reliable and excellent electrical performance in the z-axis and good workability, handling, converting and attaching during use in, for example, electronic assembly applications.

The conductive, nonwoven adhesive layer 12 includes a nonconductive, nonwoven, porous substrate 16 having pores or passageways 22, a first surface 24 and a second, opposite surface 26. The passageways 22 of the nonwoven substrate 16 are sized such that the conductive particles 20 can penetrate from the first surface 24 through to the second surface 26 of the nonwoven substrate 16. Use of the term "passageways" throughout the specification will refer to pores or passageways. Examples of suitable nonwoven substrate materials include, but are not limited to: polyethylene terephthalate (PET) fabric, nylon, polyester, acrylic fiber, rayon and cellulose. Although the conductive, nonwoven adhesive layer 12 is discussed as including a nonwoven substrate fabric, any porous substrate having passageways may be used, including woven fabrics, mesh, porous membranes and foams. A metal or carbon fiber based woven or non-woven material may also be employed.

In one embodiment, the nonwoven substrate 16 is between about 10 and about 100 µm thick, particularly between about 20 and about 50 µm thick and more particularly between about 20 and about 35 µm thick.

The nonwoven substrate 16 is embedded in the adhesive material 18, which fills at least a portion of the passageways 22 of the nonwoven substrate 16, resulting in improved cohesion in the conductive, nonwoven adhesive layer 12. In one embodiment, the adhesive material 18 substantially fills the entirety of the passageways 22. However, due to small bubbles that become trapped in the nonwoven substrate 16 during adhesive coating, the adhesive material 18 may not fill 100% of the volume of the passageways 22. In one embodiment, the passageways are filled such that the nonwoven substrate 16 includes less than about 10% voids, particularly less than about 5% voids, and more particularly less than about 2% voids.

In one embodiment, the adhesive material 18 is a pressure sensitive adhesive (PSA) material. To achieve pressure sensitive adhesive characteristics, the corresponding polymer can be tailored to have a resultant glass transition temperature (Tg) of less than about 0° C. Examples of suitable PSA materials include, but are not limited to: rubber-based PSAs, silicone based PSAs and acrylic based PSAs. Particularly suitable pressure sensitive adhesive are (meth)acrylate copolymers. Such copolymers typically are derived from an adhesive precursor solution comprising about 40% by weight to about 98% by weight, often at least 70% by weight, or at least 85% by weight, or even about 90% by weight, of at least one alkyl (meth)acrylate monomer that, as a homopolymer, has a Tg of less than about 0° C.

Examples of such alkyl (meth)acrylate monomers are those in which the alkyl groups comprise from about 4 carbon atoms to about 12 carbon atoms and include, but are not limited to, n-butyl acrylate, 2-ethylhexyl acrylate, isooctyl acrylate, isononyl acrylate, isodecyl acrylate, and mixtures thereof. Optionally, other vinyl monomers and alkyl (meth)acrylate monomers which, as homopolymers, have a Tg greater than 0° C., such as methyl acrylate, methyl methacrylate, isobornyl acrylate, vinyl acetate, styrene, and the like, may be utilized in conjunction with one or more of the low Tg alkyl (meth)acrylate monomers, provided that the Tg of the resultant (meth)acrylate copolymer is less than about 0° C.

In some embodiments, the adhesive precursor solution may also contain oligomers and/or other polymers. If polymers are included in the adhesive precursor solution, they are generally present in no greater than 50% by weight, based on the total weight of monomers, oligomers and polymers in the adhesive precursor solution.

In some embodiments, it is desirable to use (meth)acrylate monomers that are free of alkoxy groups. Alkoxy groups are understood by those skilled in the art.

Acidic and basic (meth)acrylate copolymers may also be used as the adhesive material. Generally, these are copolymers of one or more alkyl (meth)acrylate monomers and one or more basic (meth)acrylate monomer(s) and/or one or more acidic (meth)acrylate monomer(s).

When used, basic (meth)acrylate copolymers useful as the pressure sensitive adhesive material typically are derived from basic monomers comprising about 2% by weight to about 50% by weight, or about 5% by weight to about 30% by weight, of a copolymerizable basic monomer. Exemplary basic monomers include N,N-dimethylaminopropyl methacrylamide (DMAPMAm); N,N-diethylaminopropyl methacrylamide (DEAPMAm); N,N-dimethylaminoethyl acrylate (DMAEA); N,N-diethylaminoethyl acrylate (DEAEA); N,N-dimethylaminopropyl acrylate (DMAPA); N,N-diethylaminopropyl acrylate (DEAPA); N,N-dimethylaminoethyl methacrylate (DMAEMA); N,N-diethylaminoethyl methacrylate (DEAEMA); N,N-dimethylaminoethyl acrylamide (DMAEAm); N,N-dimethylaminoethyl methacrylamide (DMAEMAm); N,N-diethylaminoethyl acrylamide (DEAEAm); N,N-diethylaminoethyl methacrylamide (DEAEMAm); N,N-dimethylaminoethyl vinyl ether (DMAEVE); N,N-diethylaminoethyl vinyl ether (DEAEVE); and mixtures thereof. Other useful basic monomers include vinylpyridine, vinylimidazole, tertiary amino-functionalized styrene (e.g., 4-(N,N-dimethylamino)-styrene (DMAS), 4-(N,N-diethylamino)-styrene (DEAS)), N-vinylpyrrolidone, N-vinylcaprolactam, acrylonitrile, N-vinylformamide, (meth)acrylamide, and mixtures thereof.

When used to form the pressure sensitive adhesive material, acidic (meth)acrylate copolymers typically are derived from acidic monomers comprising about 2% by weight to about 30% by weight, or about 2% by weight to about 15% by weight, of a copolymerizable acidic monomer. Useful acidic monomers include, but are not limited to, those selected from ethylenically unsaturated carboxylic acids, ethylenically unsaturated sulfonic acids, ethylenically unsaturated phosphonic acids, and mixtures thereof. Examples of such compounds include those selected from acrylic acid, methacrylic acid, itaconic acid, fumaric acid, crotonic acid, citraconic acid, maleic acid, oleic acid, beta-carboxyethyl acrylate, 2-sulfoethyl methacrylate, styrenesulfonic acid, 2-acrylamido-2-methylpropanesulfonic acid, vinylphosphonic acid, and the like, and mixtures thereof. Due to their availability, typically ethylenically unsaturated carboxylic acids are used.

In certain embodiments, the poly(meth)acrylic pressure sensitive adhesive material is derived from between about 1 and about 20 weight percent of acrylic acid and between about 99 and about 80 weight percent of at least one of isooctyl acrylate, 2-ethylhexyl acrylate or n-butyl acrylate composition. In some embodiments, the pressure sensitive adhesive material is derived from between about 2 and about 10 weight percent acrylic acid and between about 90 and about 98 weight percent of at least one of isooctyl acrylate, 2-ethylhexyl acrylate or n-butyl acrylate composition.

The pressure sensitive adhesive can be inherently tacky. If desired, tackifiers can be added to the adhesive precursor solution before formation of the pressure sensitive adhesive. In one embodiment, the adhesive precursor solution includes up to about 30% tackifier, particularly between about 2 and 20% tackifier and more particularly between about 5 and about 15% tackifier. Useful tackifiers include, for example, rosin ester resins, aromatic hydrocarbon resins, aliphatic hydrocarbon resins, and terpene resins. In general, light-colored tackifiers selected from hydrogenated rosin esters, terpenes, or aromatic hydrocarbon resins can be used.

Other materials can be added for special purposes, including, for example, fillers, oils, plasticizers, antioxidants, UV stabilizers, pigments, curing agents and polymer additives. Exemplary fillers include, but are not limited to a heat conductive filler, a flame resistant filler, an anti-static agent, a foaming agent, polymeric microspheres and thermosets.

The adhesive material 18 may have additional components added to the adhesive precursor solution. For example, the mixture may include a multifunctional crosslinker. Such crosslinkers include thermal crosslinkers which are activated during the drying step of preparing solvent coated adhesives and crosslinkers that copolymerize during the polymerization step. Such thermal crosslinkers may include multifunctional isocyanates, aziridines, multifunctional (meth)acrylates, and epoxy compounds. Exemplary crosslinkers include difunctional acrylates such as 1,6-hexanediol diacrylate or multifunctional acrylates such as are known to those of skill in the art. Useful isocyanate crosslinkers include, for example, an aromatic diisocyanate available as DESMODUR L-75 from Bayer, Cologne, Germany. Ultraviolet, or "UV", activated crosslinkers can also be used to crosslink the pressure sensitive adhesive. Such UV crosslinkers may include benzophenones and 4-acryloxybenzophenones. Typically, the crosslinker, if present, is added to the adhesive precursor solutions in an amount of from about 0.05 parts by weight to about 5.00 parts by weight based upon the organic components in the adhesive precursor solution.

In addition, the adhesive precursor solution for the provided adhesive materials can include a thermal or a photoinitiator. Examples of thermal initiators include peroxides such as benzoyl peroxide and its derivatives or azo compounds such as VAZO 67, available from E. I. du Pont de Nemours and Co. Wilmington, Del., which is 2,2'-azobis-(2-methylbutyronitrile), or V-601, available from Wako Specialty Chemicals, Richmond, Va., which is dimethyl-2,2'-azobisisobutyrate. A variety of peroxide or azo compounds are available that can be used to initiate thermal polymerization at a wide variety of temperatures. The adhesive precursor solutions can include a photoinitiator. Particularly useful are initiators such as IRGACURE 651, available from BASF, Tarrytown, N.Y., which is 2,2-dimethoxy-2-phenylacetophenone. The initiators are typically added to the adhesive precursor solutions in the amount of from about 0.05 parts by weight to about 2 parts by weight.

In other embodiments, the adhesive material 18 may be a thermosetting adhesive material. More specifically, an adhesive material that can be B-staged (a B-stageable material) may be used. Ultraviolet (UV) B-staging is preferred. In this approach, a dual cure adhesive composition is employed. The first cure is initiated by UV or another light source which initiates a curing reaction to thicken the composition prior to final curing. The final curing is conducted using a thermal curing system. The adhesive composition contains UV curable monomers and/or oligomers which are mixed with thermally curable monomers and or oligomers. In addition, the corresponding initiators and/or curing agents for both curing mechanisms will be added to the adhesive mixture. After thorough mixing, the adhesive composition is coated on at least one release liner and may be coated between two release liners. During this coating process, a non-woven may be simultaneously embedded in the adhesive coating. The coated composition is then exposed to UV radiation to at least partially cure the UV curable components of the composition. At this stage, the composition still has a sufficient amount of tack to enable it to be a pressure sensitive adhesive.

The UV curable monomers and initiators may be those previously described herein. The thermosetting monomers and/or oligomers of the adhesive composition may be epoxy and phenoxy based materials. Other thermosetting resins include urethane and phenolic based materials. In addition, one or more appropriate crosslinkers, curatives and/or accelerators may be added to the adhesive composition. For example, for an epoxy, a crosslinkers such as a dicyandiamide may be used. A preferred dicyandiamide is available under the trade designation Dicyanex 1400B from Air Products and Chemicals, Inc., Allentown, Pa. Accelerators may also be added, a preferred accelerator for an epoxy being a urea-based accelerator, e.g. a urea based accelerator available under the trade designation Amicure UR from Air Products and Chemicals, Inc.

The conductive, nonwoven adhesive layer 12 includes conductive particles 20 that penetrate through the nonwoven substrate 16 and the adhesive material 18. The D99 metal particle size is defined as the distance of the longest direction of the conductive particle 20. The D99 conductive particle size is at least as same as or larger than the thickness of the nonwoven substrate 16 In one embodiment, the thickness of the nonwoven substrate 16 is between about 15 and 100 um,—and the D99 conductive particle size is from 15 um. In one embodiment, the D99 conductive particle size is at least as long as the thickness of the nonwoven substrate 16, particularly at least about 10% thicker and more particularly at least about 20% thicker than the thickness of the nonwoven substrate 16.

In one embodiment, the conductive, nonwoven adhesive layer 12 includes between about 1 and about 50% conductive particles, particularly between about 1 and about 30% conductive particles 20 and more particularly between about 2 and about 15% conductive particles 20 by weight. In one embodiment, the adhesive material 18 includes between about 1 and about 50% conductive particles 20, particularly between about 1 and about 15% conductive particles 20 and more particularly between about 2 and about 10% conductive particles 20 by volume.

The term "conductive particles", as used herein, generally refers to particles that are electrically conductive and enable at least z-axis electrical conductivity in the electrically conductive tapes. However, such particles may also provide a dual role, being both electrically and thermally conductive. Examples of suitable conductive particles include, but are not limited to: silver, nickel, copper, tin and aluminum; silver coated-copper, -nickel, -aluminum, -tin and -gold; nickel coated-copper and -silver; silver coated- or nickel coated-graphite, -glass, -ceramics, -plastics, -silica, -elastomers and -mica; and combinations thereof. In one embodiment, the conductive particles 20 in the adhesive material 18 include nickel. An example of suitable, commercially available nickel includes, but is not limited to, T225 from Inco, Vale Canada Limited, Toronto, Canada.

The conductive particles 20 may also be commonly employed conductive particles such as carbon particles or metal particles of gold, tin, zinc, platinum, palladium, iron, tungsten, molybdenum, solder or the like, and combinations thereof. In some embodiments, it is possible to use non-conductive particles of a polymer such as polyethylene, polystyrene, phenol resin, epoxide resin, acryl resin or benzoguanamine resin, or glass beads, glass bubbles, silica, graphite or a ceramic, whose surfaces have been covered, at least partially, with a conductive coating of a metal or the like or which contain dispersed within them conductive materials.

The conductive particles 20 can take on any shape known to those of skill in the art without departing from the intended scope of the present invention as long as the longest distance is at least as thick as the thickness of the adhesive material 18. For example, the conductive particles 20 are available in a variety of shapes (spherical, ellipsoidal, cylindrical, flakes, needle, whisker, platelet, agglomerate, crystal, acicular). The particle may have a slightly rough or spiked surface. The shape of the electrically conductive particles is not particularly limited. Combinations of particle types, shapes, sizes, and hardness may be used in the compositions of the invention.

The release liner 14 is positioned along the first surface 24 of the conductive, nonwoven adhesive layer 12 and protects the conductive, nonwoven adhesive layer 12 from dust and debris until ready for use. Typical release liners known in the art may be employed. Examples of suitable release liners include but are not limited to, polyethylene terephthalate (PET) release liners and paper release liners.

The conductive, nonwoven adhesive layer 12 can be laminated onto various metal layers to form a single-sided tape structure.

Various manufacturing methods can be employed to form the conductive, nonwoven adhesive layer 12 including, but not limited to: lamination of a transfer adhesive to one or both sides of the appropriate nonwoven substrate 16, imbibing an adhesive solution, i.e. an adhesive contained in solvent, into at least some of the pores/passageways 22 of the nonwoven substrate 16 followed by solvent removal and optional curing or imbibing a substantially 100% solids adhesive precursor solution, comprising monomers, oligomers and/or dissolved polymers, into the pores/passageways 22 of the nonwoven substrate 16 followed by curing of the adhesive precursor solution to form an adhesive. The imbibing method, i.e. allowing a liquid to flow into at least some of the pores/passageways 22 of the nonwoven substrate 16, can be accomplished by any known methods including dip coating, spray coating, knife coating, roll coating and the like. When an adhesive precursor solution is used, the conductive particles 20 may be added and mixed into the solution prior to imbibing the solution into at least some of the pores/passageways 22 of the nonwoven substrate 16. Once mixed into the adhesive precursor solution, the conductive particles 20 may be considered as part of the adhesive precursor solution.

In another method, the adhesive material 18 including the conductive particles 20 is first coated onto the release liner 14. A very thin nonwoven substrate 16 is then successively laminated onto the coated adhesive material 18 and conductive particles 20. The nonwoven substrate, adhesive material 18 and conductive particles 20 are then aged at elevated temperature and/or under pressure to embed the laminated nonwoven substrate 16 into the adhesive material 18, resulting in a conductive, nonwoven adhesive layer 12. The conductive, nonwoven adhesive layer 12 provides good z-axis electrical properties and differential adhesion.

The method used to fabricate the conductive, nonwoven adhesive layer 12 can affect the resulting structure of the conductive, nonwoven adhesive layer 12. When using a lamination technique to laminate a transfer adhesive to the nonwoven substrate 16, the adhesive material 18 may be in the passageways 22 at or near the first surface 24, the second surface 26 or both surfaces of the nonwoven substrate 16. The depth of penetration of the adhesive material 18 into the pores/passageways 22 of the nonwoven substrate 16 is dependent on the pressure applied during lamination, the flow properties of the transfer adhesive and properties of the nonwoven substrate 16 such as, for example, the pore size and thickness of the nonwoven substrate 16. To facilitate penetration of the adhesive material 18 into the nonwoven substrate 16, the nonwoven/adhesive laminate may be annealed at elevated temperatures. In one embodiment, the nonwoven/adhesive laminate is annealed at between about 30° C. and about 100° C. Under appropriate conditions, the adhesive material 18 may be able to penetrate the entire depth of the nonwoven substrate 16. In another embodiment, the adhesive material 18 may at least partially fill at least some of the pores/passageways 22 of the nonwoven substrate 16. Thus, depending on the method used to fabricate the conductive, nonwoven adhesive layer 12, the adhesive material 18 may penetrate the entire thickness of the nonwoven substrate 16, as well as form first and second surfaces 24, 26 of the conductive, nonwoven adhesive layer 12, as shown in FIG. 1. However, no matter how the adhesive material 18 is deposited, the adhesive material 18 spans the entirety of the nonwoven substrate 16 and extends to the first and second surfaces 24, 26.

Due to its construction, the conductive, double-sided tape 10 is at least conductive along the z-axis, i.e., there is a path for electrical conductivity through the thickness of the tape, enabling electrical conductivity between first and second surfaces 24, 26. In some embodiments, it is preferred that the tape exhibits only z-axis conductivity. In one embodiment, the conductive, double-sided tape 10 is between about 20 and about 150 µm thick, particularly between about 25 and about 125 µm thick and more particularly between about 30 and about 100 µm thick.

Figure 2:
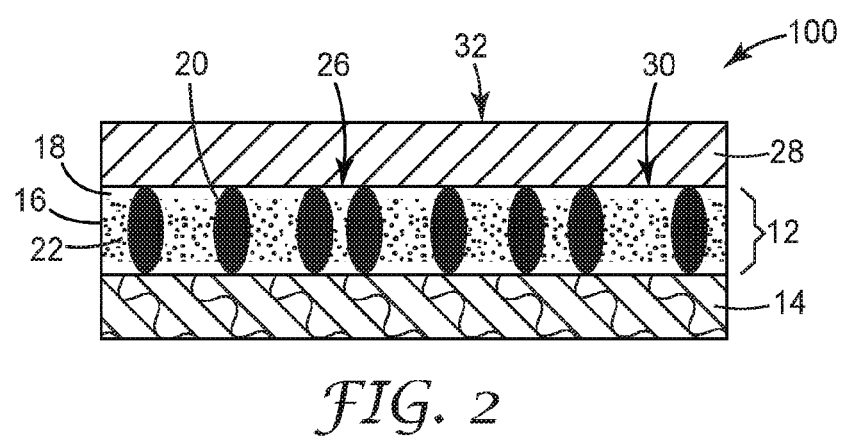
FIG. 2 is a cross-sectional view of a first embodiment of a conductive, single-sided tape of the present invention.

FIG. 2 shows a cross-sectional view of a first embodiment of a conductive, single-sided tape 100 formed from the conductive, double-sided tape 10 of FIG. 1. The conductive-single-sided tape 100 includes the conductive, nonwoven adhesive layer 12 and release liner 14 of the double-sided tape 10 and also includes a metal layer 28. The metal layer 28 includes a first surface 30 and a second surface 32. The conductive, nonwoven adhesive layer 12 is positioned between the first surface 30 of the metal layer 28 and the release liner 14. The metal layer 28 provides improved physical properties, x-y conductivity through the adhesive layer 18, and electromagnetic interference (EMI) shielding. The metal layer can be those known in the art, a metal layer comprising softer, more pliable metals being preferred. Exemplary metal layers include, but are not limited to: aluminum foil, copper foil and tin plated copper foil.

In one embodiment, the metal layer is between about 1 and about 150 µm thick, particularly between about 5 and about 125 µm thick and more particularly between about 6 and about 30 µm thick.

In one embodiment, a carbon black polymeric binder is coated on the second surface 32 the metal layer 28.

Figure 3:
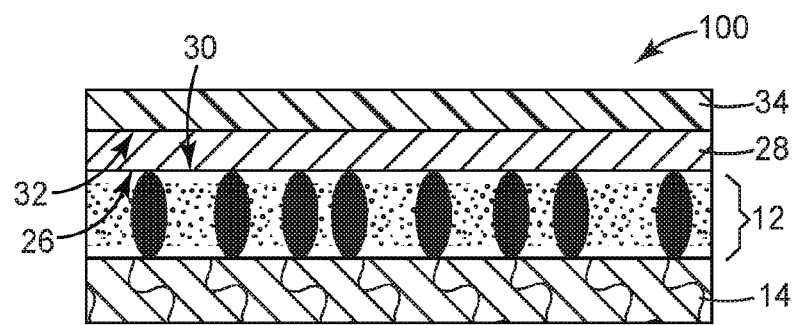
FIG. 3 is a cross-sectional view of a second embodiment of a conductive, single-sided tape of the present invention.

FIG. 3 shows a cross-sectional view of a second embodiment of a conductive, single-sided tape 10 formed from the conductive, double-sided tape 10 of FIG. 1. The second embodiment of the conductive, single-sided tape 100 is similar in construction and function to the first embodiment of the conductive, single-sided tape 100 except that the second embodiment of the conductive, single-sided tape 100 also includes a polymeric film 34 positioned on the second surface 32 of the metal layer 28 opposite the nonwoven adhesive layer 12. Due to the polymeric film 34, the conductive, single-sided tape 100 is conductive along the x and y axes but insulated along the z-axis.

The polymeric film 34 may be one of various backing materials used in the tape art and functions to increase the tensile strength of the conductive, single-sided tape 100 and to insulate the z-axis of the conductive, single-sided tape 100. In one embodiment, the polymeric film 34 is a black polyethylene terephthalate (PET) PET film. Exemplary polymeric films include, but are not limited to, non-conductive films.

In one embodiment, the polymeric film 34 has a thickness of between about 2.5 and about 100 microns, particularly between about 4.5 and about 50 microns and more particularly between about 4.5 microns and about 12.5 microns.

In one embodiment, the polymeric film layer can be multi-layered with the same films or other films.

In one embodiment, a carbon black polymeric binder is coated on the polymeric film 34 such that the polymeric film 34 is layered between the metal foil 28 and the carbon black polymeric binder.

In one embodiment, the conductive, single-sided tape 100 may also include a colored pressure-sensitive adhesive. The adhesive may be colored by using carbon black or a conventional dye.

In one embodiment, a very thin metal layer can be directly plated onto the polymeric film, for example, by metal evaporation and sputtering. Exemplary plated metals include gold, silver and other metals.

One method of forming the conductive, single-sided tape 100 of the present invention is by using a dual liner coating and UV curing process. The method includes preparing an, adhesive precursor solution, including a plurality of conductive particles and a photoinitiator, imbibing the adhesive precursor solution in pores of a nonwoven substrate, passing the nonwoven substrate and prepolymer between a first and second liner, curing the prepolymer to form a conductive, nonwoven embedded pressure sensitive adhesive layer, removing the first liner from the conductive, nonwoven embedded pressure sensitive adhesive layer, and laminating the conductive, nonwoven embedded pressure sensitive adhesive layer onto a metal backing.

Another method of forming the conductive, single-sided tape 100 of the present invention includes using a single liner coating, thermal curing and transfer laminating process. The method includes coating an adhesive precursor solution including a plurality of conductive particles, such as a acrylic monomer solution, onto a release liner, drying and heat curing the coated adhesive material on the release liner and transferring the adhesive material layer on the release liner to form a conductive, nonwoven embedded pressure sensitive adhesive layer and laminating the conductive, nonwoven embedded pressure sensitive adhesive layer onto a metal backing.

EXAMPLES

The present invention is more particularly described in the following examples that are intended as illustrations only, since numerous modifications and variations within the scope of the present invention will be apparent to those skilled in the art. Unless otherwise noted, all parts, percentages, and ratios reported in the following example are on a weight basis.

Test Methods

Electrical Resistance 1

Z-axis electrical resistance was measured between two pieces of copper foil using a Keithley 580 micro-ohmmeter available from Keithley Instruments Inc., Cleveland, Ohio. The sample was prepared as follows. Two, 10 mm×30 mm, pieces of copper foil were laminated together using the conductive adhesive transfer tape. The ends of the copper foil pieces were laminated together orthogonal to one another, such that, a 10 mm×10 mm contact overlap was produced, forming an area of contact of about 100 mm$^2$. The leads of the micro-ohmmeter were then contacted to the non-overlapping region of the copper foil pieces, to measure the z-axis resistance through the conductive adhesive transfer tape. The resistance was recorded after a 60 second dwell time.

Electrical Resistance 2

Figure 4:
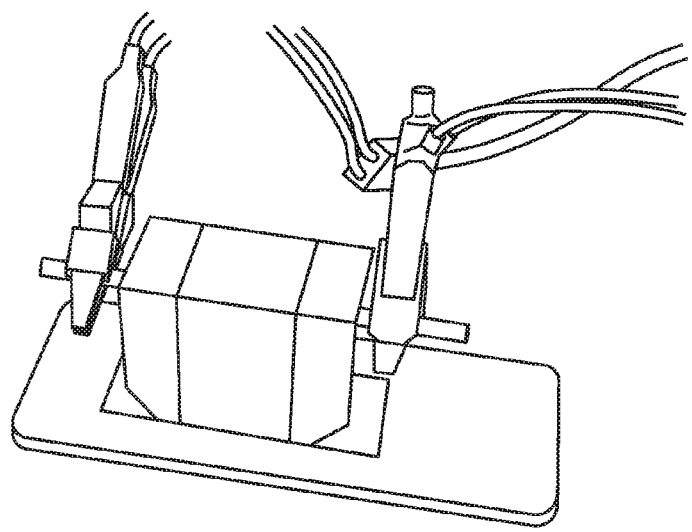
FIG. 4 is a perspective view of an apparatus for testing electrical resistance.

Electrical resistance was measured using a modified version of US MIL-G-835288™. The adhesive being measured was placed on 1 inch (2.54 cm) wide by 2 inch (3.08 cm) long non-conductive surface, a glass panel. A surface probe having two gold plated copper blocks, separated 25.4 mm apart from each other by an insulator, was placed on the surface of the conductive, nonwoven adhesive layer to be measured. The probe weight was 250 g and the contact size of each block to the adhesive was 5 mm×25.4 mm, i.e. 127 mm$^2$. The leads of the Keithley 580 micro-ohmmeter were connected to the gold plated copper blocks. FIG. 4 shows the apparatus and sample/probe configuration. After a 60 second stabilization period, the resistance was recorded.

Adhesion

For the double-sided adhesive transfer tape, one side of the tape was laminated onto 25 micron thick PET film and 180° peel adhesion was measured according to ASTM 1000 with a stainless steel panel as the substrate. For the single-sided adhesive tape, 180° peel adhesion was measured according to ASTM 1000 with a stainless steel panel as the substrate.

Example 1

A conductive, pressure sensitive adhesive (PSA) was prepared as follows. 390 g of an acrylic copolymer solution, 59% solids, (available under the trade designation SEN-7000 from Geomyung Corp., Cheon-an, Korea), 5.85 g of an isocyanate crosslinker solution, 75% solids, (available under the trade designation GT75 from Geomyung Corp., Cheon-an, Korea), 10 g silver coated glass particles (available under the trade designation SG100P12 from Potters Ind. Valley Forge, Pa.) and 150 g toluene were mixed together using conventional high shear mixing, forming an adhesive precursor solution. The adhesive precursor solution was then coated on a silicone treated paper liner by a conventional notch bar coating method and dried by passing through a 6 meter long oven having three heating zones. The three zones were set at temperatures of 40° C., 75° C. and 120° C., with the temperature increasing sequentially along the length of the oven. The line speed was 2 m/min. The coated adhesive material with conductive particles was then laminated to one side of an 18 micron thick, 6 g/m$^2$ polyester nonwoven substrate (available under the trade designation VT Paper 6G/M$^2$ from Nippon Paper Papylia Co., Tokyo, Japan), by pressing between a pair of laminating rolls, followed by winding the conductive, nonwoven adhesive into a roll. The roll of conductive, nonwoven adhesive was then annealed at 50° for 5 days to further embed the thin nonwoven substrate into the adhesive material, forming a conductive, double-sided adhesive transfer tape, Example 1. Following the test method procedures described above, the electrical resistance (test method Electrical Resistance 1) and adhesion were measured. The electrical resistance was measured to be 0.05 ohms. The adhesion was 2,240 grams force/inch (882 grams force/cm) on the back side, i.e. the liner side, and 760 grams force/inch (299 grams force/cm) on the face side of the adhesive.

Example 2

A conductive, pressure sensitive adhesive (PSA) was prepared as follows. 390 g of an acrylic copolymer solution, 59% solids, (available under the trade designation SEN-7000 from Geomyung Corp., Cheon-an, Korea), 5.85 g of an isocyanate crosslinker solution, 75% solids, (available under the trade designation GT75 from Geomyung Corp., Cheon-an, Korea), 10 g silver coated glass particles (available under the trade designation SG100P6 from Potters Ind. Valley Forge, Pa.) and 150 g toluene were mixed together using conventional high shear mixing, forming an adhesive precursor solution. The adhesive precursor solution precursor was then coated on a silicone treated paper liner by a conventional notch bar coating method and dried by passing through an oven, as described in Example 1. The coated adhesive material with conductive particles was then laminated to one side of a 18 micron thick, 6 g/m$^2$ polyester nonwoven substrate (available under the trade designation VT Paper 6G/M$^2$ from Nippon Paper Papylia Co.), by pressing between a pair of laminating rolls, followed by winding the conductive, nonwoven adhesive into a roll. The roll of conductive, nonwoven adhesive was then annealed at 50° for 5 days to further embed the thin nonwoven substrate into the adhesive material. Next, a 20 micron thick PET laminated copper foil backing, having an 8 micron thick copper layer and 12 micron thick PET layer, was laminated onto the conductive, nonwoven adhesive using conventional lamination technique. The exposed adhesive side of the conductive, nonwoven adhesive was laminated to the copper foil side of the backing to make a single-side, foil tape. This single-side, foil tape was annealed at 50° C. for 24 hours, Example 2. Following the test method procedures described above, the electrical resistance (test method Electrical Resistance 2) and adhesion were measured. The electrical resistance was measured to be 0.05 ohms/square and the adhesion was 2,550 grams force/inch (1,004 grams force/cm) on the back side of the adhesive, i.e. the liner side.

Comparative Example A

Comparative example A was produced similarly to Example 1, except no silver coated glass particles were used. Following the test method procedures described above, the electrical resistance (test method Electrical Resistance 1) and adhesion were measured. Due to its high value, the electrical resistance was not measureable. The adhesion was 2,590 grams force/inch (1,020 grams force/cm) on the back side, i.e. the liner side, and 890 grams force/inch (350 grams force/cm) on the face side of the adhesive.

Although the present invention has been described with reference to preferred embodiments, workers skilled in the art will recognize that changes may be made in form and detail without departing from the spirit and scope of the invention.

The invention claimed is:

1. A conductive, double-sided tape comprising:
   a conductive, nonwoven adhesive layer comprising:
      an adhesive material;
      a nonconductive, nonwoven substrate having a plurality of passageways, wherein the nonconductive, nonwoven substrate is embedded in the adhesive material; and
      a plurality of conductive particles penetrating through the nonconductive, nonwoven substrate and the adhesive material, wherein the conductive particles have a D99 particle size larger than a thickness of the nonconductive, nonwoven substrate
      wherein the conductive, double-sided tape exhibits only z-axis conductivity.

2. The conductive double-sided tape of claim 1, further comprising a release liner positioned adjacent the conductive, nonwoven adhesive layer.

3. The conductive double-sided tape of claim 1, further comprising a release liner positioned on at least one side of the conductive, nonwoven adhesive layer.

4. The conductive double-sided tape of claim 1, wherein the conductive particles comprise at least one of: nickel, copper, tin or aluminum; silver coated-copper, -nickel, -aluminum, -tin or -gold; nickel coated-copper or -silver; silver coated- or nickel coated-graphite, -glass, -ceramics, -plastics, -silica, -elastomers or -mica; or combinations thereof.

5. The conductive double-sided tape of claim 1, wherein the conductive double-sided tape is between about 25 and about 150 µm thick.

6. The conductive double-sided tape of claim 1, wherein the adhesive material is a pressure sensitive adhesive material.

7. The conductive double-sided tape of claim 1, wherein the adhesive material is a B-stageable adhesive material.

8. The conductive double-sided tape of claim 1, further comprising at least one additional filler selected from the group consisting of: a heat conductive filler, a flame resistant filler, an anti-static agent, a foaming agent, polymeric microspheres and thermosets.

9. A conductive, single-sided tape comprising:
   an adhesive material;
   a nonconductive, nonwoven substrate embedded within the adhesive material;
   a plurality of conductive particles penetrating through the adhesive material and the nonwoven substrate, wherein the conductive particles have a D99 particle size larger than a thickness of the nonwoven substrate; and
   a metal layer positioned adjacent the nonwoven substrate wherein the conductive, single-sided tape exhibits only z-axis conductivity.

10. The conductive, single-sided tape of claim 9, further comprising a polymeric film or a multilayered polymeric film positioned adjacent the metal layer.

11. The conductive, single-sided tape of claim 10, further comprising a carbon black polymeric binder coated on the polymeric film.

12. The conductive, single-sided tape of claim 9, further comprising a carbon black polymeric binder coated on the metal layer.

13. The conductive single-sided tape of claim 9, wherein the conductive particles comprise at least one of: nickel, copper, tin or aluminum; silver coated-copper, -nickel, -aluminum, -tin or -gold; nickel coated-copper or -silver; silver coated- or nickel coated-graphite, -glass, -ceramics, -plastics, -silica, -elastomers or -mica; or combinations thereof.

14. The conductive single-sided tape of claim 9, wherein the conductive single-sided tape is between about 25 and about 150 µm thick.

15. The conductive single-sided tape of claim 9, wherein the adhesive material is a pressure sensitive adhesive material.

16. The conductive single-sided tape of claim 9, wherein the adhesive material is a B-stageable adhesive material.

17. The conductive single-sided tape of claim 9, further comprising a filler selected from the group consisting of: a heat conductive filler, a flame resistant filler, an anti-static agent, a foaming agent, polymeric microspheres and thermosets.

* * * * *